(12) United States Patent
Wang et al.

(10) Patent No.: US 12,183,417 B2
(45) Date of Patent: Dec. 31, 2024

(54) MEMORY DEVICE AND MANUFACTURING METHOD OF THE SAME

(71) Applicant: TAIWAN SEMICONDUCTOR MANUFACTURING COMPANY, LTD., Hsinchu (TW)

(72) Inventors: Po-Sheng Wang, Hsinchu County (TW); Kao-Cheng Lin, Taipei (TW); Yangsyu Lin, New Taipei (TW); Yen-Huei Chen, Hsinchu County (TW); Cheng Hung Lee, Hsinchu County (TW); Jonathan Tsung-Yung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 153 days.

(21) Appl. No.: 17/882,156

(22) Filed: Aug. 5, 2022

(65) Prior Publication Data

US 2024/0046969 A1 Feb. 8, 2024

(51) Int. Cl.
G11C 16/04 (2006.01)
G11C 7/10 (2006.01)
G11C 11/419 (2006.01)
H10B 10/00 (2023.01)

(52) U.S. Cl.
CPC .............. *G11C 7/10* (2013.01); *G11C 11/419* (2013.01); *H10B 10/00* (2023.02)

(58) Field of Classification Search
CPC ................. G11C 7/10; G11C 11/419
See application file for complete search history.

(56) References Cited

U.S. PATENT DOCUMENTS

| | | | | |
|---|---|---|---|---|
| 6,643,805 B1 * | 11/2003 | Kikutake | ............... | G11C 29/40 365/201 |
| 9,001,613 B2 * | 4/2015 | Wang | ..................... | G11C 7/227 365/191 |
| 9,324,393 B2 * | 4/2016 | Wang | ...................... | G11C 7/18 |

* cited by examiner

*Primary Examiner* — Pho M Luu
(74) *Attorney, Agent, or Firm* — Maschoff Brennan

(57) ABSTRACT

A memory device in an integrated circuit is provided, including an input/output (I/O) circuit, a first memory segment and a second memory segment that separated from the first memory segment in a first direction, a first pair of data lines on a first side of the integrated circuit, extending in the first direction and configured to couple the first memory segment to the I/O circuit, and a second pair of data lines separated from the first pair of data lines in a second direction, different from the first direction, on a second side, opposite to the first side, of the integrated circuit, and configured to couple the second memory segment to the I/O circuit. A first width of the first pair of data lines is different from a second width of the second pair of data lines.

20 Claims, 18 Drawing Sheets

MEMORY DEVICE AND MANUFACTURING METHOD OF THE SAME

BACKGROUND

The semiconductor integrated circuit (IC) industry has experienced rapid growth. Technological advances in IC materials and design have produced generations of ICs. In some approaches, optimization of metal track arrangement in memory devices is in demand for reduced latency in signal transmission and area saving.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
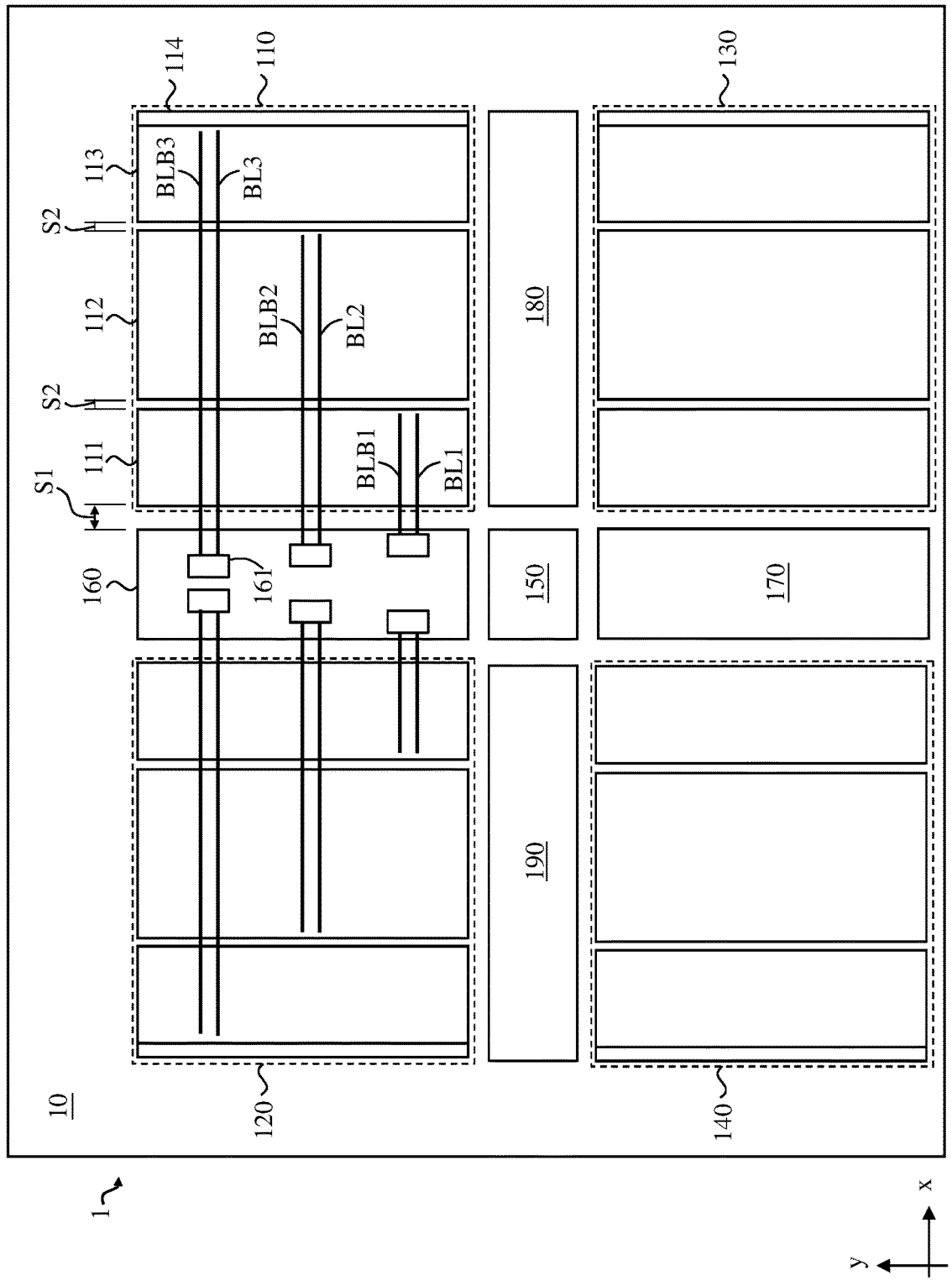
FIG. 1 is a schematic diagram of part of an integrated circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of part of an integrated circuit 1, in accordance with some embodiments of the present disclosure. For illustration, the integrated circuit 1 includes a memory device 110 having memory banks 110-140, a control circuit 150, input/output circuits 160-170, and word line driver circuits 180-190. In some embodiments, the control circuit 150 is configured to access memory cells in the memory banks 110-140 in read and write operation by controlling the input/output circuits 160-170 and the word line driver circuits 180-190. For example, the word line driver circuit 180 activates, in response to a control signal (for example, associated with a word line address) from the 150, one of word lines (not shown for simplicity) that are coupled to the memory cells in the memory bank 110 to select one memory cell for accessing data therein. The input/output circuit 160 further activates, in response to another control signal (for example, associated with a column address) from the control circuit 150, one of read pass gate circuits 161 that is coupled to the selected memory cell through a corresponding pair of data lines (for example, BL1-BLB1, BL2-BLB2, or BL3-BLB3) to fetch the data in the selected memory cell. In some embodiments, the input/output circuit 160 further includes sense amplifiers (not shown) for the read operation. In some embodiments, the memory device 10 includes static random access memory (SRAM) cells or any other suitable memory cells.

In some embodiments, the input/output circuit 160 is arranged between the memory banks 110-120 and configured to read/write data of memory cells in the memory banks 110-120. Similarly, the input/output circuit 170 is arranged between the memory banks 130-140 and configured to read/write data of memory cells in the memory banks 130-140. The word line driver circuit 180 is arranged between the memory banks 110 and 130 and coupled to word lines in the memory banks 110 and 130. Similarly, the word line driver circuit 190 is arranged between the memory banks 120 and 140 and coupled to word lines in the memory banks 120 and 140.

As the embodiments shown in FIG. 1, the memory banks 110-120 are mirror images with respect to the input/output circuit 160, and the memory banks 130-140 are mirror images with respect to the input/output circuit 170. Furthermore, the memory banks 110 and 130 are mirror images with respect to the word line driver circuit 180, and the memory banks 120 and 140 are mirror images with respect to the word line driver circuit 190.

For illustration, the memory bank 110 is apart from the input/output circuit 160 by a spacing 51. The memory bank 110 includes memory segments 111-113 and a strap cell 114 along x direction. The memory segments 111-113 are separated from each other by a spacing S2, while the memory segment 112 is interposed between the memory segments 111 and 113. In some embodiments, the spacing S1 (for example, 7.5 poly pitches) is about 2.5 times of the spacing S2 (for example, 2 poly pitches), and is about double of a width of the strap cell 114 (for example, 4 poly pitches.) A poly pitch corresponds to a distance between gate structures in the memory cells in the memory segments 111-113.

In some embodiments, each of the memory segments 111 and 113 includes a number of memory cells which is smaller than a number of memory cells in the memory segment 112. For example, each of the memory segments 111 and 113 has 256 memory cells arranged in rows in each column (extending in x direction), while the memory segment 112 has 512 memory cells arranged in rows in each column. Alternatively stated, the memory segment 112 includes more rows of memory cells than the memory segments 111 and 113. In some embodiments, the memory segment 112 has a larger width in x direction than that of the memory segments 111 and 113, as shown in FIG. 1.

The memory device 10 further includes complementary data lines BL1-BLB1, BL2-BLB2, and BL3-BLB3 that extend in x direction and are configured to couple, separately, the memory segments 111-113 to the input/output circuit 160. Specifically, in some embodiments, the data lines BL1-BLB1 and BL3-BLB3 are arranged on a front side of the integrated circuit 1, and the data lines BL2-BLB2 are arranged on a back side, opposite to the front side, of the integrated circuit 1.

In some embodiments, active semiconductor device (e.g., the memory segments 111-113) included in the integrated circuit 1 is formed on its front side and some metal routing on its backside. In some embodiments, the active semiconductor device on the front side of the integrated circuit 1 is formed on a substrate (not shown) in a front side process. After the front side process is complete, the integrated circuit 1 is flipped upside down, such that a backside surface of the substrate faces upwards. The substrate is further thinned down and removed. In some embodiments, thinning is accomplished by a CMP process, a grinding process, or the like. Accordingly, backside process is performed to form structures on the backside of the integrated circuit 1.

The configurations of FIG. 1 are given for illustrative purposes. Various implements are within the contemplated scope of the present disclosure. For example, in various embodiments, the data lines BL1-BLB1 and BL3-BLB3 are arranged on the back side of the integrated circuit 1, and the data lines BL2-BLB2 are arranged on the front side, opposite to the front side, of the integrated circuit 1. In various embodiments, the memory segments 111-113 have the same number of memory cells and have the same width in x direction (column direction).

Figure 2A:
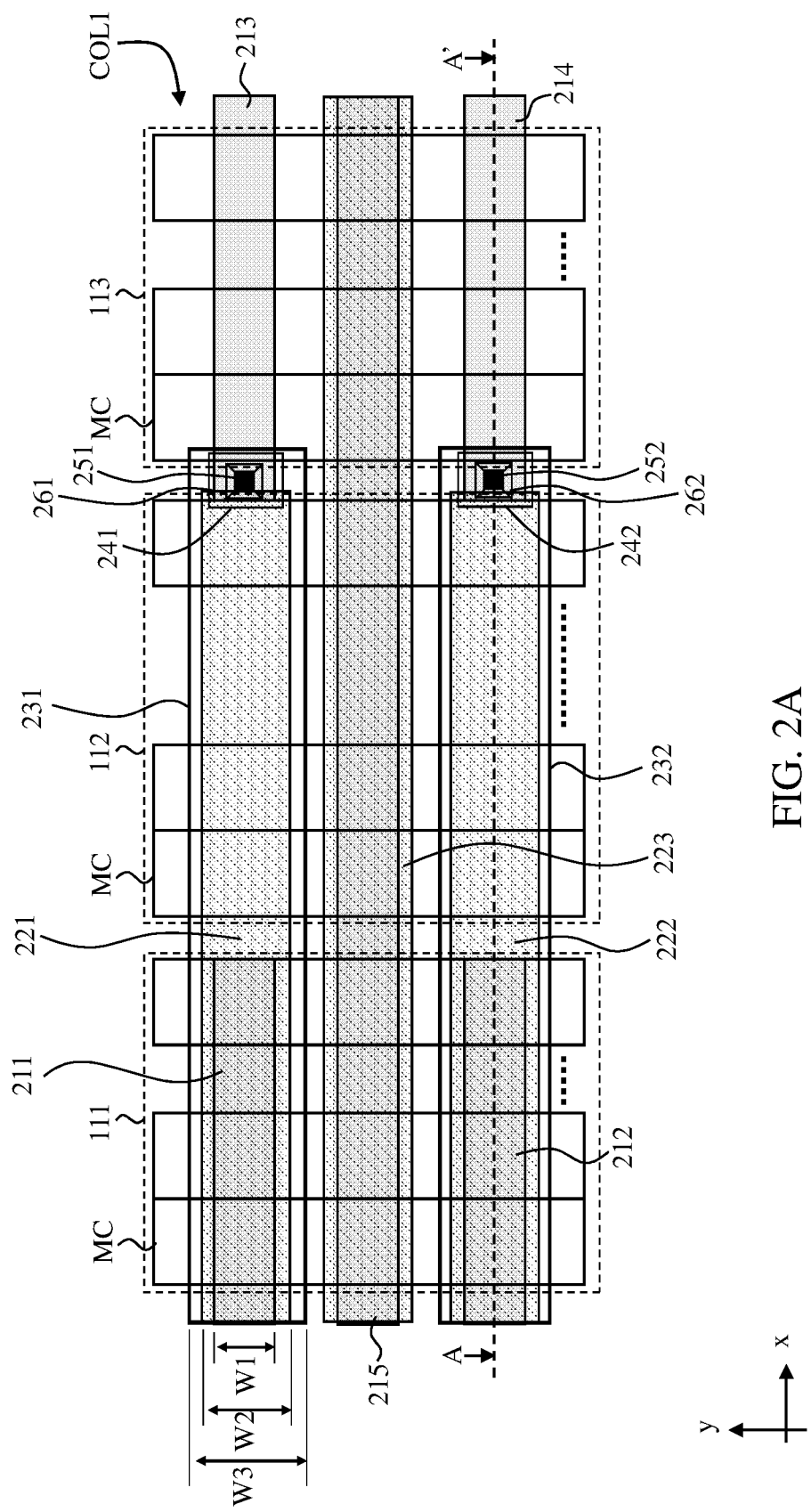
FIG. 2A is a layout diagram in a plan view of a section of the memory device corresponding to FIG. 1.
Figure 2B:
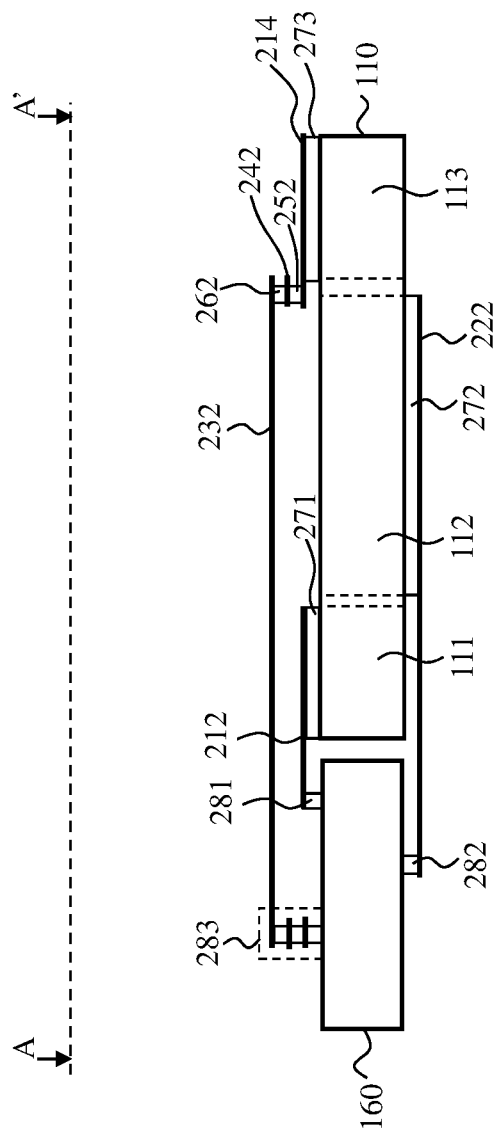
FIG. 2B is a cross-sectional view of the layout diagram in FIG. 2A along line AA', in accordance with some embodiments.

Reference is now made to FIGS. 2A-2B. FIG. 2A is a layout diagram in a plan view of a section of the memory device 10 corresponding to FIG. 1, and FIG. 2B is a cross-sectional view of the layout diagram in FIG. 2A along line AA', in accordance with some embodiments. With respect to FIG. 1, like elements in FIGS. 2A-2B are designated with the same reference numbers for ease of understanding. The specific operations of similar elements, which are already discussed in detail in the above paragraphs, are omitted herein for the sake of brevity, unless there is a need to introduce the co-operation relationship with the elements shown in FIGS. 2A-2B.

For illustration, the memory segments 111-113 includes multiple memory cells MC in a column COL1. In some embodiments, during the read/write operation, one of the memory cells MC in the column COL1 is selected to transmit data therein to the input/output circuit 160 through corresponding data lines coupled thereto.

As illustratively shown in FIG. 2A, the memory device 10 includes front side conductive lines (e.g., metal-zero (M0) metal lines) 211-215, back side conductive line (e.g., back side metal-zero (BM0) metal lines) 221-223, front side conductive lines (e.g., metal-two (M2) metal lines) 231-232, front side conductive lines (e.g., metal-one (M1) metal lines) 241-242, and vias 251-252, 261-262. In some embodiments, the front side conductive lines 211-215 are formed in a first layer on the front side of the integrated circuit 1, the front side conductive lines 241-242 are formed in a second layer above the first layer on the front side of the integrated circuit 1, and the front side conductive lines 231-232 are formed in a third layer above the first and second layers on the front side of the integrated circuit 1. The back side conductive lines 221-223 are formed in a first layer on the back side of the integrated circuit 1. Alternatively stated, the back side conductive lines 221-223 are arranged below the front side conductive lines 211-215, 231-232, and 241-242.

In some embodiments, the front side conductive lines 211-212 correspond to the data lines BL1-BLB1 in FIG. 1 and couple to the memory cells MC in the memory segment 111. The back side conductive lines 221-222 correspond to the data lines BL2-BLB2 in FIG. 1 and couple to the memory cells in the memory segment 112. The front side conductive lines 231-232 correspond to portions, passing the memory cells MC in the memory segments 111-112, of the data lines BL3-BLB3, and the front side conductive lines 213-214 correspond to the other portions of the data line BL3-BLB3 that couple to the memory cells MC in the memory segment 113. Specifically, the front side conductive line 231 couples to the front side conductive line 241 through the via 261 and further couples to the front side conductive line 213 through the via 251 coupled between the front side conductive line 241 and the front side conductive line 213. Similarly, the front side conductive line 232 couples to the front side conductive line 242 through the via 262 and further couples to the front side conductive line 214 through the via 252 coupled between the front side conductive line 242 and the front side conductive line 214. Accordingly, lengths of the data lines BL1-BLB1, BL2-BLB2, BL3-BLB3 are different from each other. In some embodiments, the data lines BL3-BLB3 have a longest length compared with lengths of the data lines BL1-BLB1 and BL2-BLB2.

In some embodiments, the front side conductive line 215 and the back side conductive line 223 are referred to as metal tracks that provide supply voltages for the memory cells MC and are interposed between data lines. In various embodiments, the front side conductive line 215 and the back side conductive line 223 are configured to transmit other signals or simply dummy metal tracks for enhancing signal isolations in the memory device 10.

For illustration, the front side conductive lines 211-215, 231-232 and the back side conductive line 221-223 extend in x direction and the front side conductive lines 241-242 extend in y direction. The front side conductive lines 211 and 231 overlap the back side conductive line 221 in the layout view, and the front side conductive lines 212 and 232 overlap the back side conductive line 222 in the layout view. The front side conductive line 215 overlaps the back side conductive line 223.

The front side conductive lines 211-215 have a width W1, the back side conductive lines 221-223 have a width W2, and the front side conductive lines 231-232 have a width W3. In some embodiments, the widths W1-W3 are different from each other. In various embodiments, the width W3 is the largest and the width W1 is the smallest. In another embodiments, the width W2 is the largest. In various embodiments, a thickness of the back side conductive line 221-223 is greater than a thickness of the front side conductive lines 211-215, the front side conductive lines 241-242 and/or the front side conductive lines 231-232.

With reference to FIG. 2B, the memory segment 111 is coupled to the input/output circuit 160 through a conductive structure 271, the front side conductive line 212, and a conductive structure 281. Similarly, the memory segment 112 is coupled to the input/output circuit 160 through a conductive structure 272, the back side conductive line 222, and a conductive structure 282, and the memory segment 113 is coupled to the input/output circuit 160 through a conductive structure 273, the front side conductive lines 214 and 232, and a conductive structure 283. As shown in FIG. 2B, the front side conductive lines 212, 232, 242, and the back side conductive line 222 are separated from each other in z direction. In some embodiments, the conductive structures 271-273 and 281-283 are separated from each other in x direction and include via(s) and metal layers for electrical connection.

In a RAM device, the resistance (R) and capacitance (C) delay of data lines and the active power of the data lines depend on, for example, widths, thickness and lengths of the data lines and the number of memory cells coupled thereto. For example, shorter and wider data lines with fewer coupled memory cells can reduce the RC delay of the RAM device, thereby increasing the memory operation speed. However, in some approaches, as the number of memory cells rises due to applications, the high R and C issues induced by the data lines become inevitable in memory devices.

Compared with the approaches, the present application utilizes back side conductive metal lines, that have larger widths and accordingly significant lower resistance and capacitance, in metal routing for portions of memory segments, and consequently, avoids RC issues in data lines and optimizes operational speed, for example, about 2-5% of speed gain in some embodiments. Furthermore, as the memory segment (e.g., the memory segment 112) sandwiched between two memory segments (e.g., the memory segments 111 and 113) requires the transition space between adjacent segments for yield requirement, and the spacing (e.g., S2) between memory segments reduces (for example, from 4 poly pitches to 2 poly pitches,) by adopting the back side metal data line configuration, which provides tremendous transition area saving for more than 50% and at least 1.5% of macro area saving. In some embodiments, assistant circuits, originally placed in the spacing, are removed for optimization.

In addition, with reference to FIGS. 1 and FIGS. 2A-2B together, as the memory banks 110 and 120 are mirror images and the memory bank 120 also includes data lines BL1-BLB1, BL2-BLB2, and BL3-BLB3, the data lines BL1-BLB1, BL2-BLB2, and BL3-BLB3 in the memory bank 120 are coupled to memory cells MC in the same column in the memory bank 120.

The configurations of FIGS. 2A-2B are given for illustrative purposes. Various implements are within the contemplated scope of the present disclosure. For example, in some embodiments, the memory segment (e.g., the memory segment 111), closest to the input/output circuit 160, is coupled to back side conductive lines (e.g., the back side conductive lines 221-222) while the memory segment adjacent to said memory segment (e.g., the memory segment 112) is coupled to front side conductive lines (e.g., the front side conductive line 211-212.)

Figure 3A:
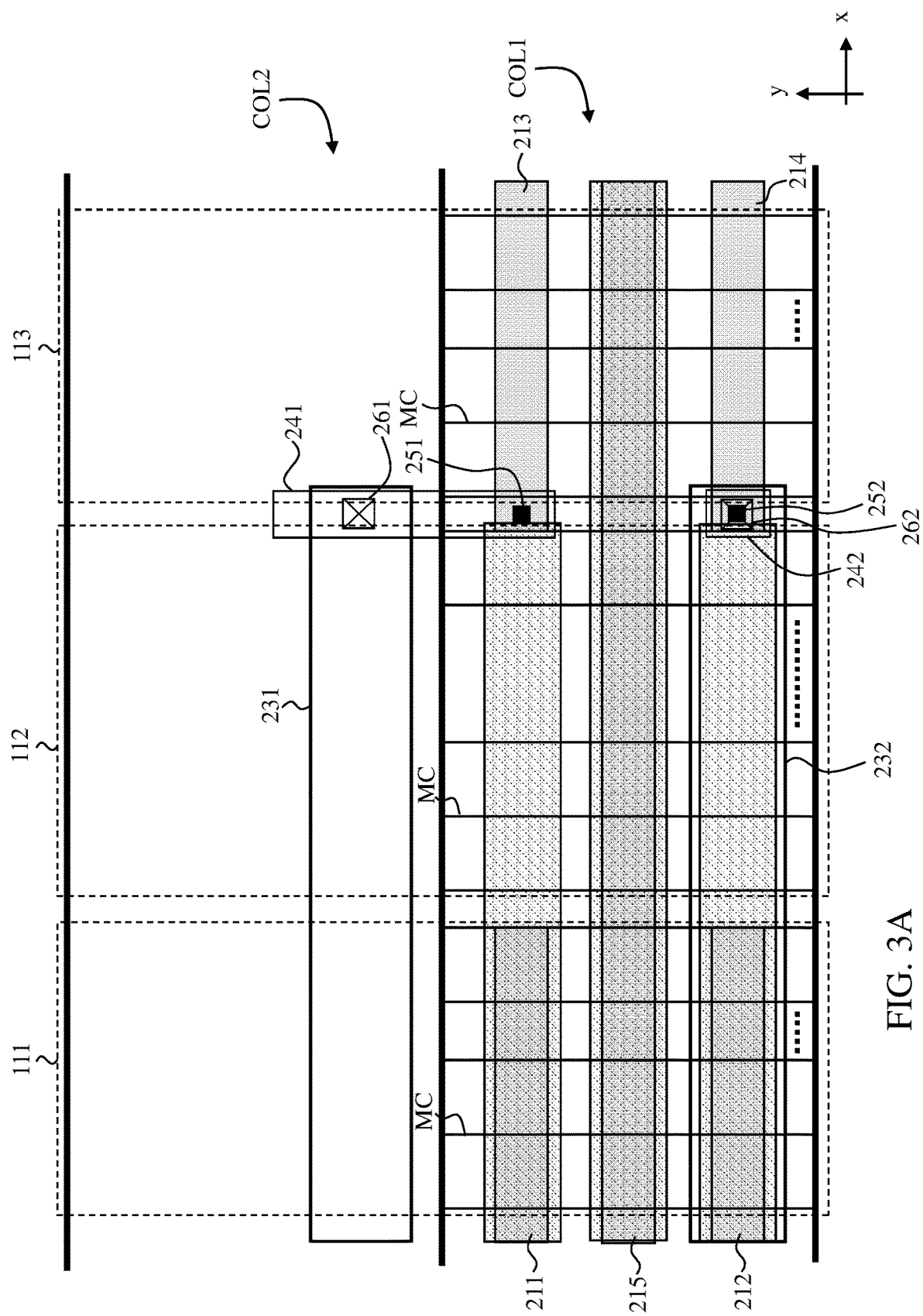
FIG. 3A is a layout diagram in a plan view of a section of the memory device corresponding to FIG. 1, in accordance with another embodiment.

Reference is now made to FIG. 3A. FIG. 3A is a layout diagram in a plan view of a section of the memory device corresponding to FIG. 1, in accordance with another embodiment. With respect to FIGS. 1-2B, like elements in FIG. 3A are designated with the same reference numbers for ease of understanding.

Compared with FIG. 2A, instead of the front side conductive line 231 overlapping the front side conductive line 211 and the back side conductive line 221, the front side conductive line 231 extends in a column COL2 next to the column COL1 and couples to the front side conductive line 213 through the front side conductive line 241 which extends through the columns COL1-COL2.

The configurations of FIG. 3A are given for illustrative purposes. Various implements are within the contemplated scope of the present disclosure. For example, in some embodiments, the front side conductive line 232 is placed in other column rather than the column COL1 and has the same configurations as of the front side conductive line 231.

Figure 3B:
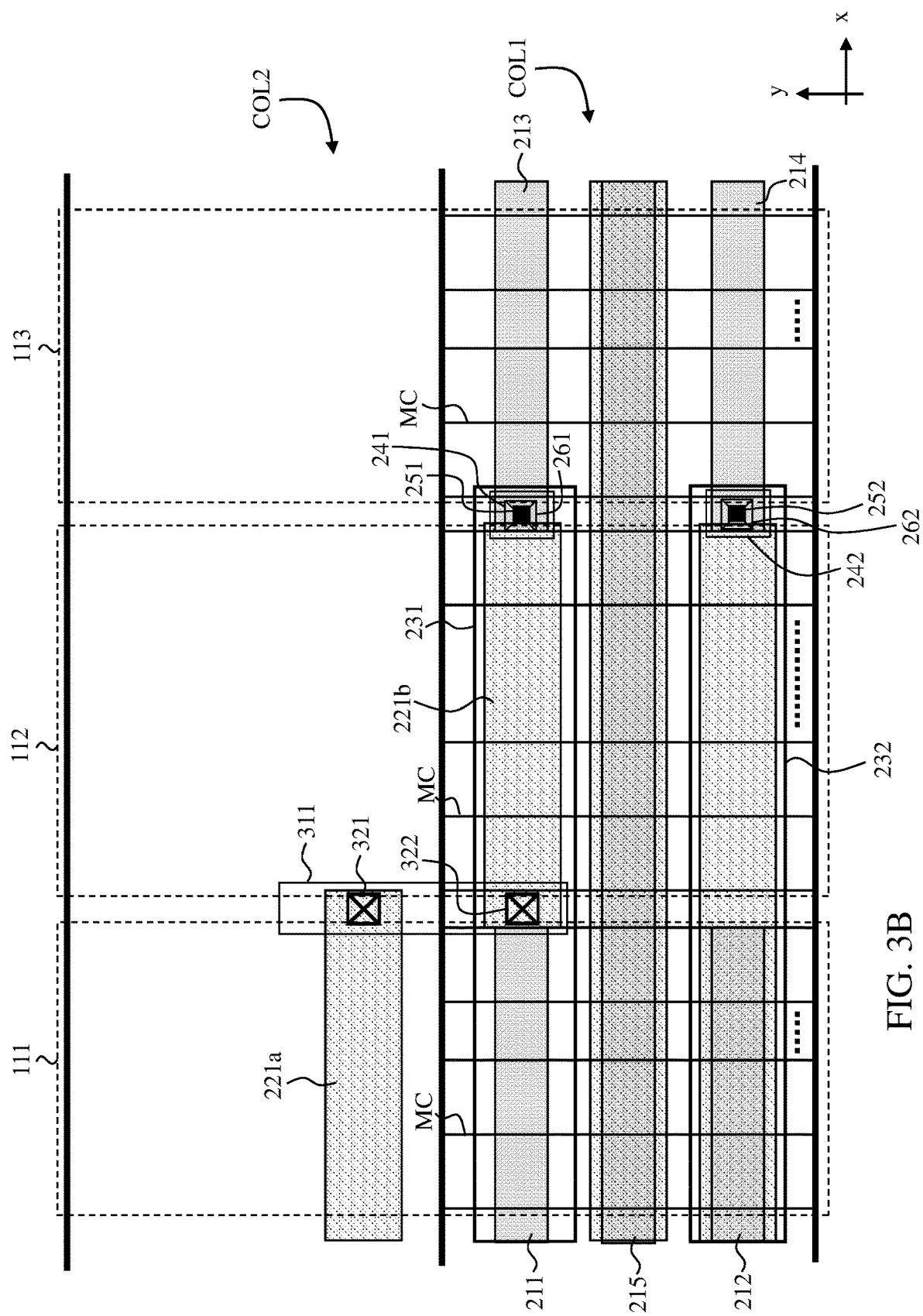
FIG. 3B is a layout diagram in a plan view of a section of the memory device corresponding to FIG. 1, in accordance with another embodiment.

Reference is now made to FIG. 3B. FIG. 3B is a layout diagram in a plan view of a section of the memory device corresponding to FIG. 1, in accordance with another embodiment. With respect to FIGS. 1-3A, like elements in FIG. 3B are designated with the same reference numbers for ease of understanding.

Compared with FIG. 2A, instead of the back side conductive line 221 extending in the column COL1 and overlapping the front side conductive lines 211 and 231, the memory device in the embodiments of FIG. 3B further includes a back side conductive line (e.g., back side metal-one (BM1) metal lines) 311, back side vias 321-322, and back side conductive lines 221a-221b that are arranged in the different columns COL1-COL2. In some embodiments, the back side conductive lines 221a-221b are configured with respect to, for example, the back side conductive lines 221 of FIG. 2A. The back side conductive line 311 is disposed in a layer below the layer in which the back side conductive lines 221a-221b are, and extends in y direction to overlap the back side conductive lines 221a-221b in the layout view shown in FIG. 3B.

In some embodiments, the back side via 321 couples the back side conductive line 221a to the back side conductive line 311. The back side via 322 couples the back side conductive line 311 to the back side conductive line 221b.

The configurations of FIG. 3B are given for illustrative purposes. Various implements are within the contemplated scope of the present disclosure. For example, in some embodiments, the back side conductive line 221a is arranged in a column next to the column COL2 and the back side conductive line 311 further extends through the column COL2 in y direction to transmit signals from the back side conductive line 221a to the back side conductive line 221b.

Figure 4:
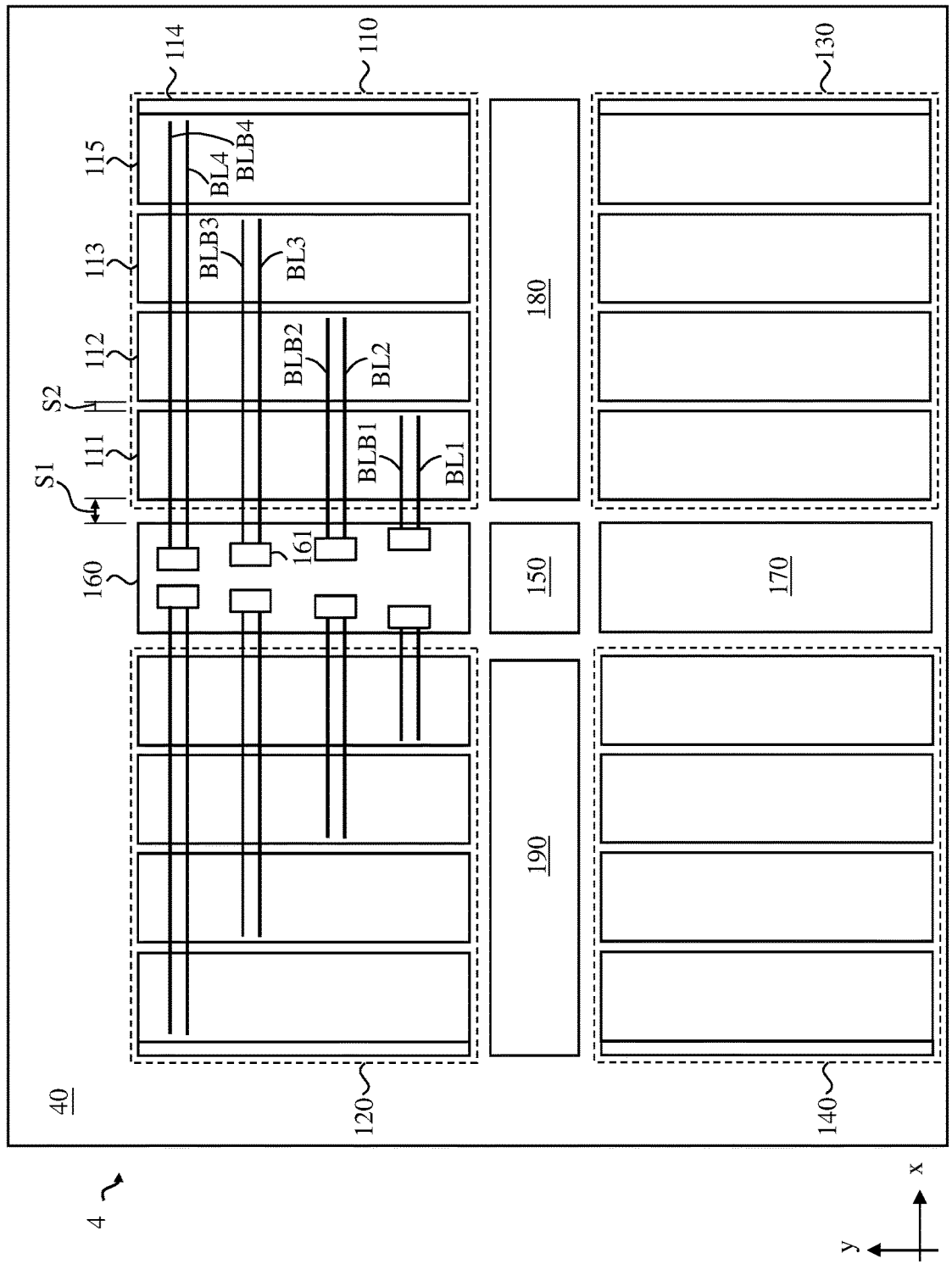
FIG. 4 is a schematic diagram of part of an integrated circuit, in accordance with some embodiments of the present disclosure.

Reference is now made to FIG. 4. FIG. 4 is a schematic diagram of part of an integrated circuit 4, in accordance with some embodiments of the present disclosure. With respect to FIGS. 1-3B, like elements in FIG. 4 are designated with the same reference numbers for ease of understanding. In some embodiments, the integrated circuit 4 is configured with respect to, for example, the integrated circuit 1 of FIG. 1.

Compared with FIG. 1, instead of having three memory segments, each of the memory banks 110-140 further includes a memory segment 115 interposed between the memory segment 113 and the strap cell 114. In the embodiments of FIG. 4, the memory segments 111-113 and 115 include a same number of memory cells (e.g., 256 memory cells MC in each column) and accordingly have a same width in x direction. The memory device 40 in the integrated circuit 4 further includes a pair of complementary data lines BL4-BLB4 coupling the memory segment 115 to the input/output circuit 160.

The configurations of FIG. 4 are given for illustrative purposes. Various implements are within the contemplated scope of the present disclosure. For example, in some embodiments, at least one of the memory segments 111-113 and 115 includes more memory cells than other memory segments. In various embodiments, the amounts of (rows of) memory cells in the memory segments 112 and 115 are greater than that in the memory segments 111 and 113.

Figure 5A:
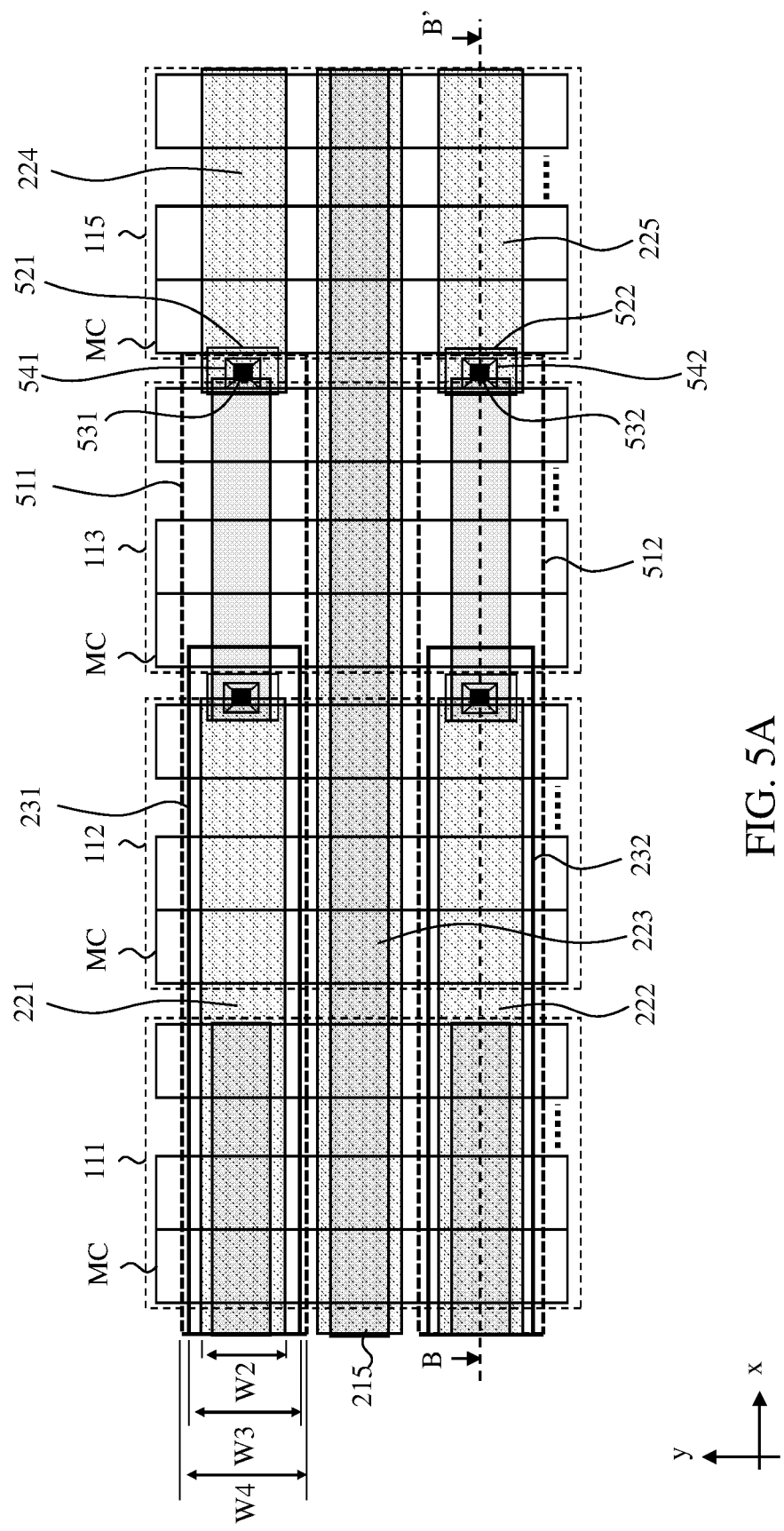
FIG. 5A is a layout diagram in a plan view of a section of the memory device corresponding to FIG. 4.
Figure 5B:
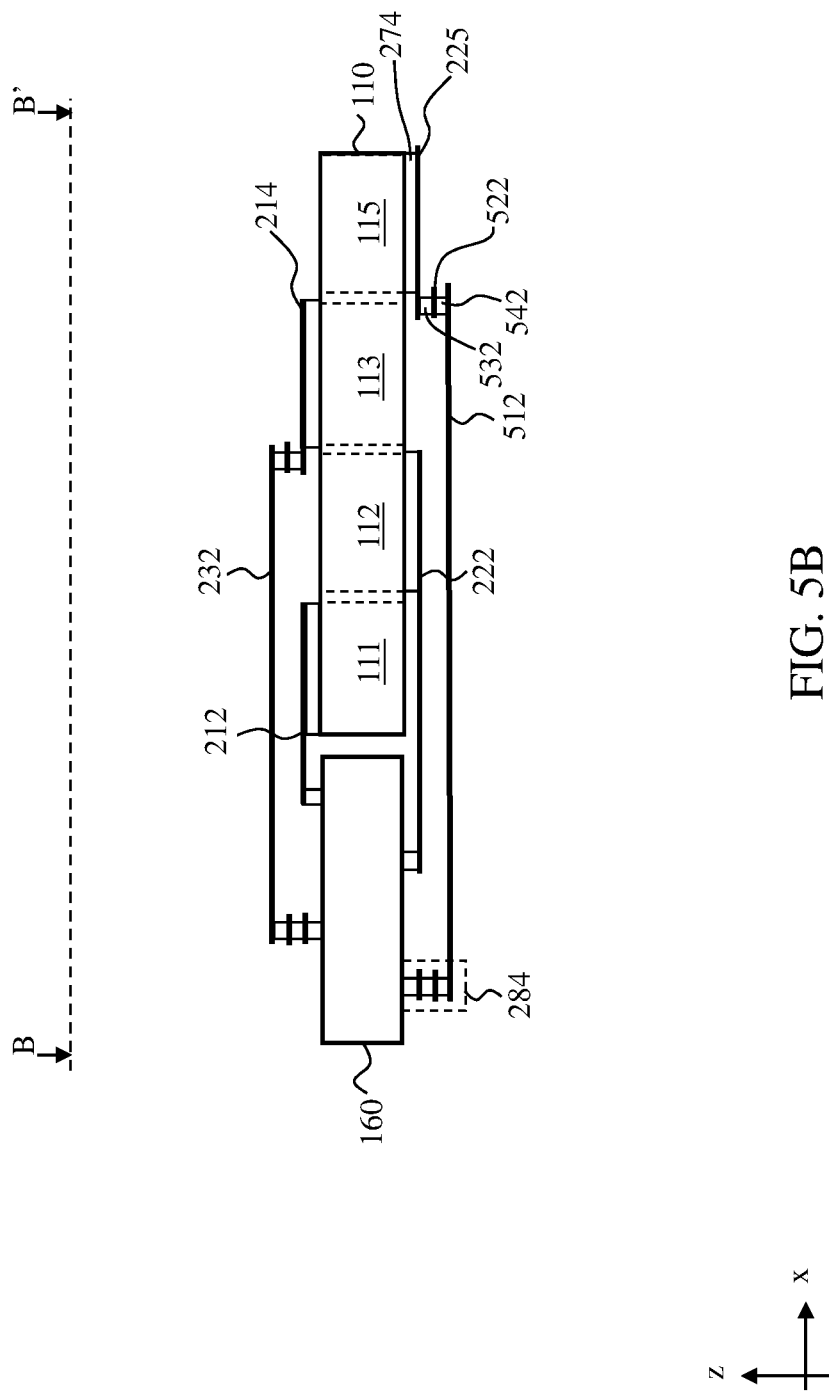
FIG. 5B is a cross-sectional view of the layout diagram in FIG. 5A along line BB', in accordance with some embodiments.

Reference is now made to FIGS. 5A-5B. FIG. 5A is a layout diagram in a plan view of a section of the memory device 40 corresponding to FIG. 4, and FIG. 5B is a cross-sectional view of the layout diagram in FIG. 5A along line BB', in accordance with some embodiments.

Compared with FIG. 2A, the integrated circuit 4 further includes back side conductive lines (e.g., back side metal-two (BM2) metal lines) 511-512, back side conductive lines (e.g., back side metal-zero (BM0) metal lines) 224-225, back side conductive lines 521-522 (e.g., back side metal-one (BM1) metal lines), and vias 531-532, 541-542. In some embodiments, the back side conductive lines 224-225 are formed in the first layer on the back side of the integrated circuit 4. The back side conductive lines 224-225 are formed in the first layer on the back side of the integrated circuit 4, and the back side conductive lines 521-522 are formed in the second layer below the first layer on the back side of the integrated circuit 4, and the back side conductive lines 511-512 are formed in the third layer, below the first and second layers, on the back side of the integrated circuit 4.

In some embodiments, the back side conductive lines 511-512 correspond to portions, passing the memory cells MC in the memory segments 111-113, of the data lines BL4-BLB4, and the back side conductive lines 224-225 correspond to the other portions of the data line BL4-BLB4 that couple to the memory cells MC in the memory segment 115. Specifically, the back side conductive line 511 couples to the back side conductive line 521 through the via 541 and further couples to the back side conductive line 224 through the via 531 coupled between the back side conductive line 521 and the back side conductive line 224. Similarly, the back side conductive line 512 couples to the back side conductive line 522 through the via 542 and further couples to the back side conductive line 225 through the via 532 coupled between the back side conductive line 522 and the back side conductive line 225. In some embodiments, the data lines BL4-BLB4 have a longest length compared with lengths of the data lines BL1-BLB1, BL2-BLB2, and BL3-BLB3.

In some embodiments, the front side conductive line 215 and the back side conductive line 223 further extend between the back side conductive lines 511-512 and 224-225, as shown in FIG. 5A.

For illustration, the back side conductive lines 511-512 overlap the front side conductive line 211-212, 214-215, 231-232 and the back side conductive line 221-222 in the layout view and extend in x direction. The back side conductive lines 521-522 extend in y direction.

The back side conductive lines 511-512 have a width W4 that is different from the widths W1-W3. In various embodiments, the width W4 is the largest among the widths W1-W4. In various embodiments, a thickness of the back side conductive line 511-512 is greater than a thickness of the front side conductive lines 211-215, the front side conductive lines 241-242 and/or the front side conductive lines 231-232.

With reference to FIG. 5B, the memory segment 115 is coupled to the input/output circuit 160 through a conductive structure 274, the back side conductive lines 512 and 225, and a conductive structure 284. In some embodiments, the conductive structures 274 and 284 are configured with respect to, for example, the conductive structures 271-273 and 281-283 and include via(s) and metal layers for electrical connection.

Figure 6:
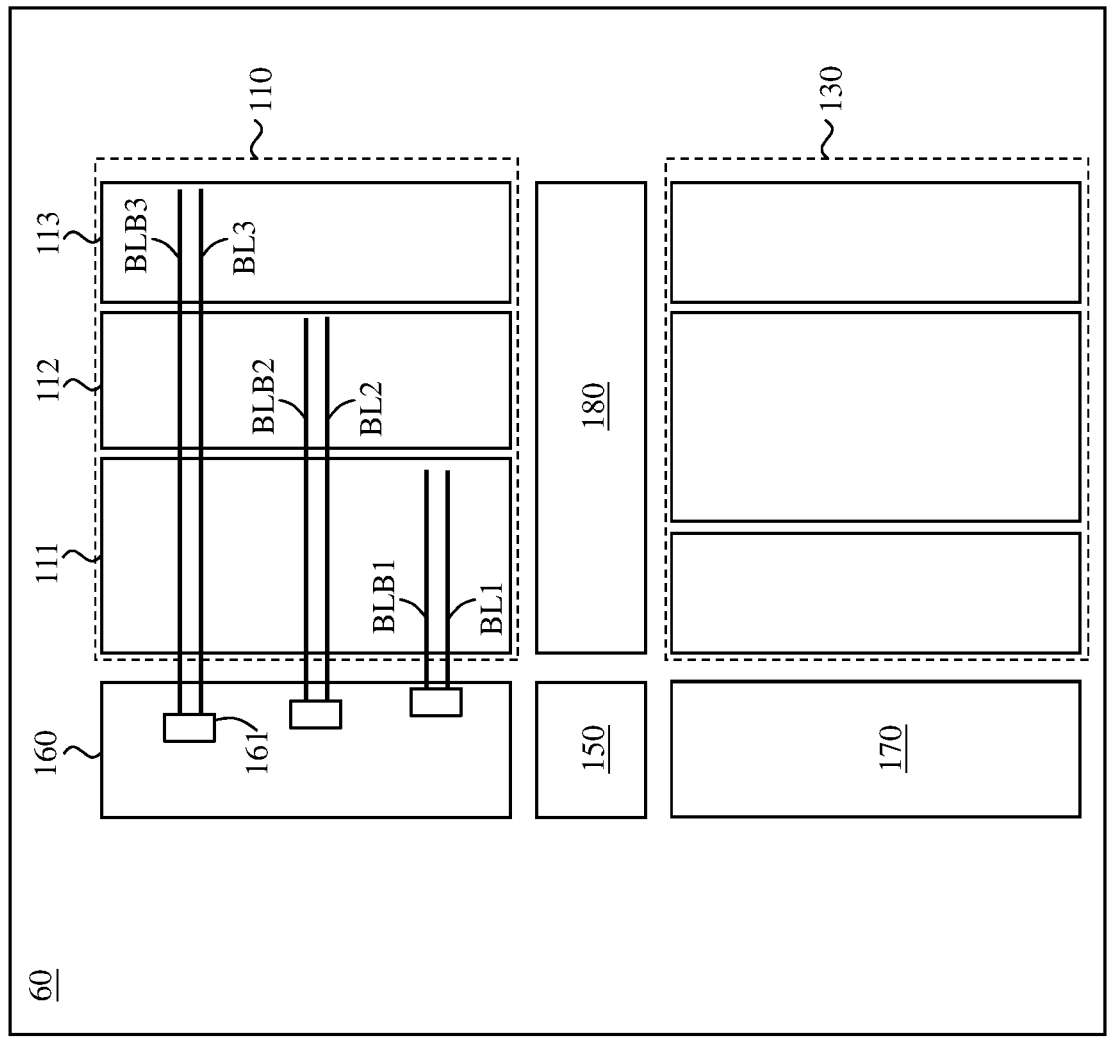
FIG. 6 is a schematic diagram of part of an integrated circuit, in accordance with some embodiments of the present disclosure.

Reference is now made to FIG. 6. FIG. 6 is a schematic diagram of part of an integrated circuit 6, in accordance with some embodiments of the present disclosure. With respect to FIGS. 1-5B, like elements in FIG. 6 are designated with the same reference numbers for ease of understanding. In some embodiments, the integrated circuit 6 is configured with respect to, for example, the integrated circuit 1 of FIG. 1.

Compared with FIG. 1, the memory segment 111, arranged closest to the input/output circuit 160, includes a largest number of memory cells, compared to the memory segments 112-113. For example, in some embodiments, the memory segments 111-113 include separately 112, 80, and 64 memory cells MC in rows in each columns. The data lines BL1-BLB1 in the memory 60 are on the front side of the integrated circuit 6 and configured with respect to, for example, the front side conductive lines 211-212 in FIG. 2A. The data lines BL2-BLB2 in the memory 60 are on the back side of the integrated circuit 6 and configured with respect to, for example, the back side conductive lines 221-222 in FIG. 2A. The data lines BL3-BLB3 in the memory 60 are on the front side of the integrated circuit 6 and configured with respect to, for example, the front side conductive lines 213-214, 231-232, 241-242 in FIG. 2A.

Figure 7B:
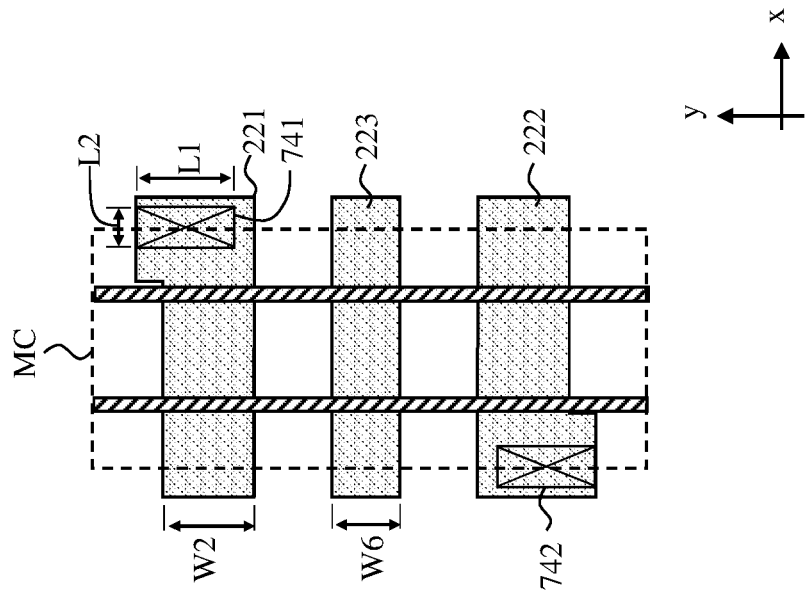
FIGS. 7A-7B are layout diagrams in a plan view of a section of the memory device corresponding to FIG. 6, in accordance with some embodiments of the present disclosure.
Figure 7A:
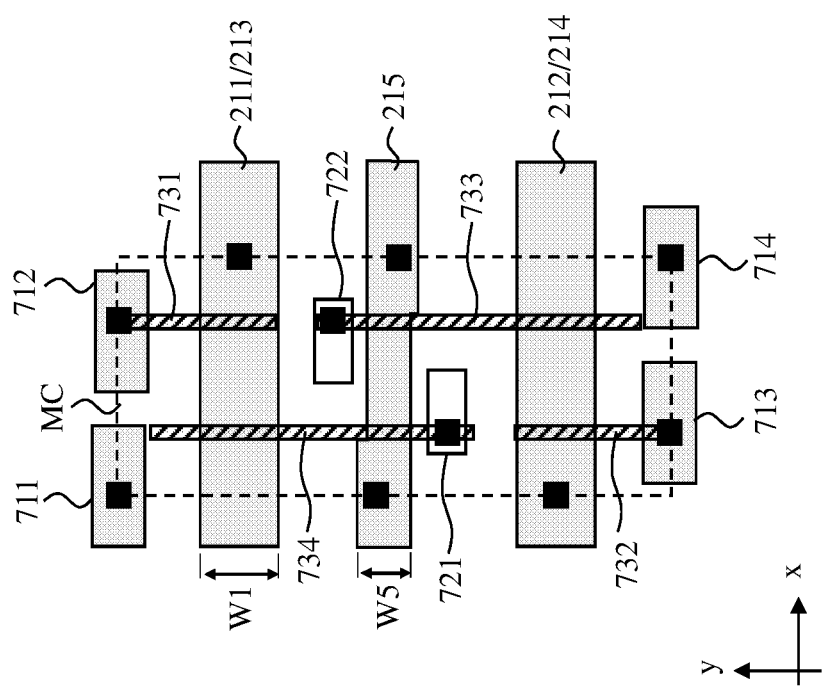

Reference is now made to FIGS. 7A-7B. FIGS. 7A-7B are layout diagrams in a plan view of a section of the memory device corresponding to FIG. 6, in accordance with some embodiments of the present disclosure.

The memory cell MC in FIG. 7A corresponds to the memory cells MC in the memory segments 111 and 113 in FIG. 6. For illustration, the memory device 60 in the integrated circuit 6 further includes front side conductive lines (e.g., metal-zero layer) 711-714, front side conductive lines (e.g., metal-two layer) 721-722, gates 731-734. In some embodiments, the front side conductive lines 711 and 714 are configured to provide a supply voltage, for example, VSS for the memory cell MC, while the front side conductive line 215 provides the supply voltage VDD for the memory cell MC. The front side conductive lines 712-713 are configured to transmit word line signals to the gates 731-732 to turned on pass gate transistors in the memory cell MC (for example, a 6T SRAM cell.)

As shown in FIG. 7A, in some embodiments, the front side conductive line 215 in FIG. 7A has a width W5 smaller than the width W1.

The memory cell MC in FIG. 7B corresponds to the memory cells MC in the memory segment 112 in FIG. 6. For illustration, the back side conductive line 223 in FIG. 7B has a width W6 smaller than the width W2.

Furthermore, the memory device 60 in the integrated circuit 6 further includes vias 741-742 each having a rectangle surface coupled to the back side conductive lines 221 (one of the data lines BL2-BLB2) and 222 (the other of the data lines BL2-BLB2). In some embodiments, the vias 741-742 have a first length L1 and a second length L2 different from the first length L1.

Compared with some approaches utilizing square vias with small contact surface attaching the data lines, with the configurations of the present application, rectangle vias having larger contact surface cut transmission resistance, accordingly, the operation speed of the memory device improves.

Figure 8B:
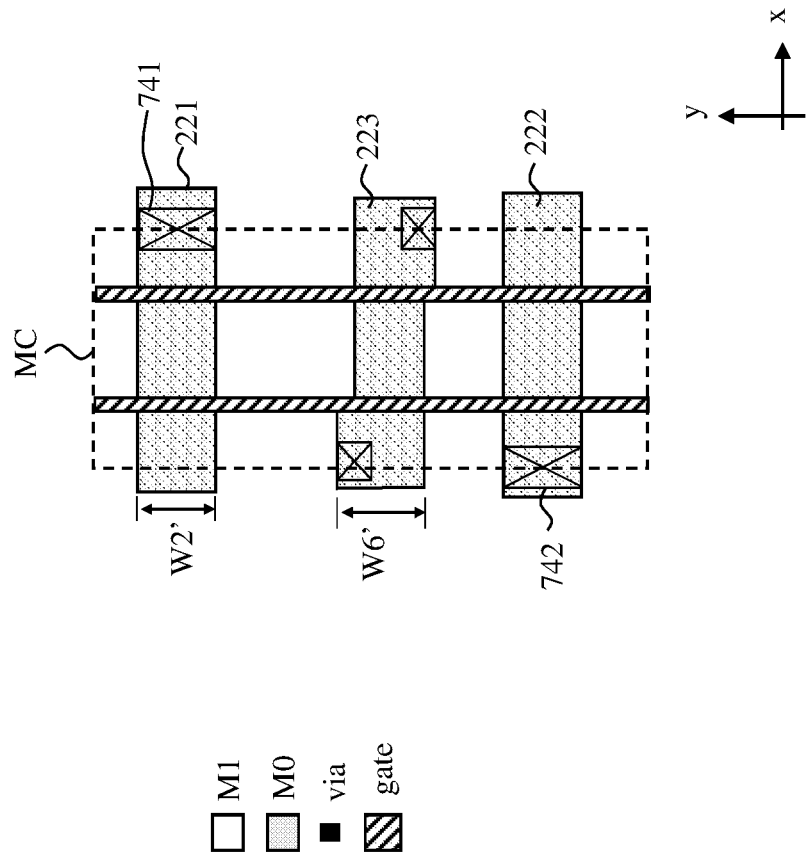
FIGS. 8A-8B are layout diagrams in a plan view of a section of the memory device corresponding to FIG. 6, in accordance with another embodiment of the present disclosure.
Figure 8A:
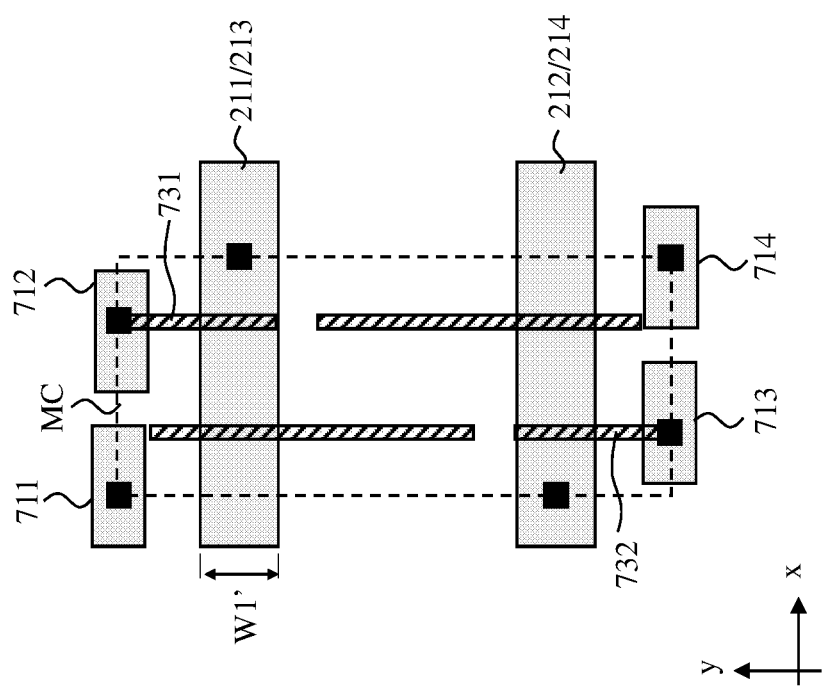

Reference is now made to FIGS. 8A-8B. FIGS. 8A-8B are layout diagrams in a plan view of a section of the memory device 60 corresponding to FIG. 6, in accordance with another embodiment of the present disclosure.

Compared with the embodiments of FIGS. 7A-7B, instead of providing the supply voltage VDD through the front side conductive line, as shown in FIG. 8B, the back side conductive line 223 is configured to provide the supply voltage VDD and has a width W6' that is greater than a width W2'. In addition, the front side conductive lines 211-214 have a width W1' that is greater than the widths W1, W2, W2', W5, W6. With the configurations above, the resistance of the front side conductive lines 211-214 decreases due to larger width and consequently improves the operation speed of the memory segments 111 and 113.

Moreover, compared with some approaches having folded bit line configurations (for example, each of two local input/output circuits interposed in and coupled to two memory arrays), the present application provides dual sided data lines for each single memory bank and significantly reduces memory device area by about 11%.

The configurations of FIGS. 6-8B are given for illustrative purposes. Various implements are within the contemplated scope of the present disclosure. For example, in some embodiments, the numbers of the memory cells MC in the memory segments 111-113 are more or less than 112, 80, and 64 memory cells.

Figure 9A:
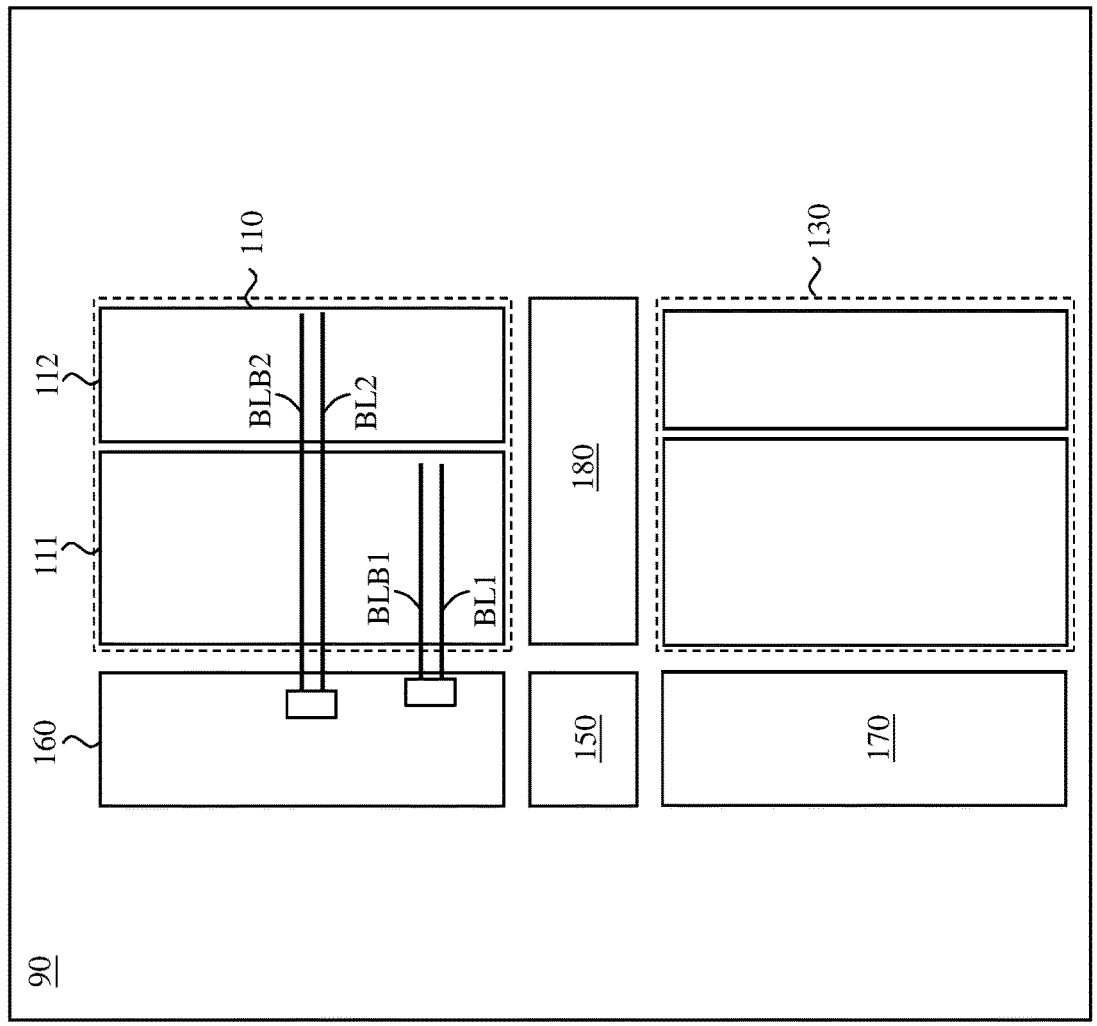
FIG. 9A is a schematic diagram of part of an integrated circuit.
Figure 9B:
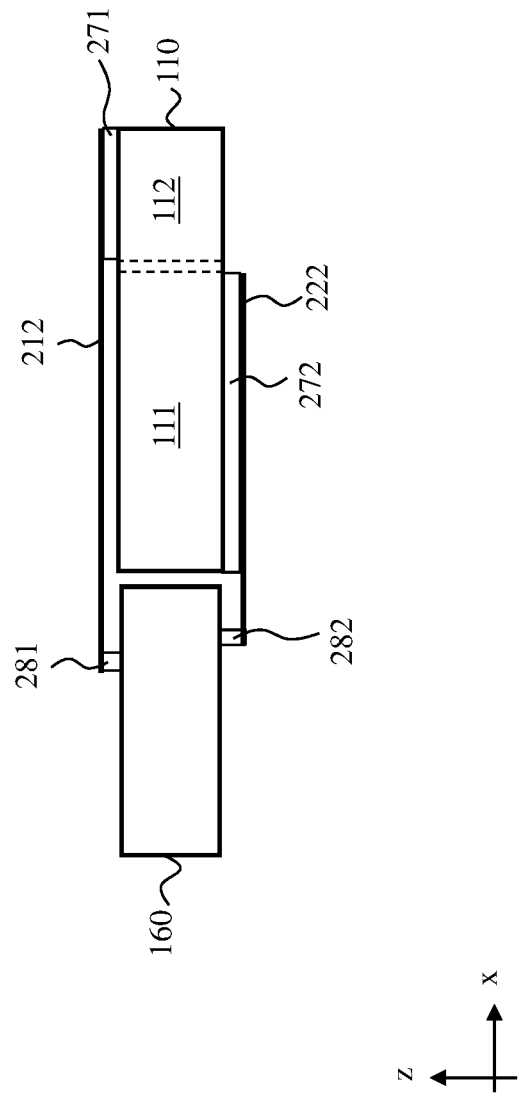
FIG. 9B is a cross-sectional view of the integrated circuit in FIG. 9A, in accordance with some embodiments.

Reference is now made to FIGS. 9A-9B. FIG. 9A is a schematic diagram of part of an integrated circuit 9, and FIG. 9B is a cross-sectional view of the integrated circuit 9, in accordance with some embodiments of the present disclosure. With respect to FIGS. 1-8B, like elements in FIGS. 9A-9B are designated with the same reference numbers for ease of understanding. In some embodiments, the integrated circuit 9 is configured with respect to, for example, the integrated circuit 6 of FIG. 6.

Compared with FIG. 6, instead of utilizing front side conductive lines to couple the memory segment closest to the input/output circuit 160, in the embodiments of FIGS. 9A-9B, the memory segment 111, having more memory cells than the memory segment 112, is coupled to the input/output circuit 160 at least through, for example, the back side conductive line 222, the conductive structures 272 and 282, and the memory segment 112 is coupled to the input/output circuit 160 at least through, for example, the front side conductive line 212, the conductive structure 271 and 281.

With the configurations of the present disclosure, as the back side data lines have less RC loading due to greater width, thickness, the RC loading of the back side data lines (for example, the back side conductive line 222) coupled to the memory segment having more cells is substantially the same with the RC loading of the data line (for example, the front side conductive line 212) coupled to the memory segment having less cells. Accordingly, minor RC latency difference is observed between memory segments.

The configurations of FIG. 9A-9B are given for illustrative purposes. Various implements are within the contemplated scope of the present disclosure. For example, in some embodiments, the memory device 90 further includes the memory segment 113 coupled to the input/output circuit 160 by the back side conductive lines.

Figure 10A:
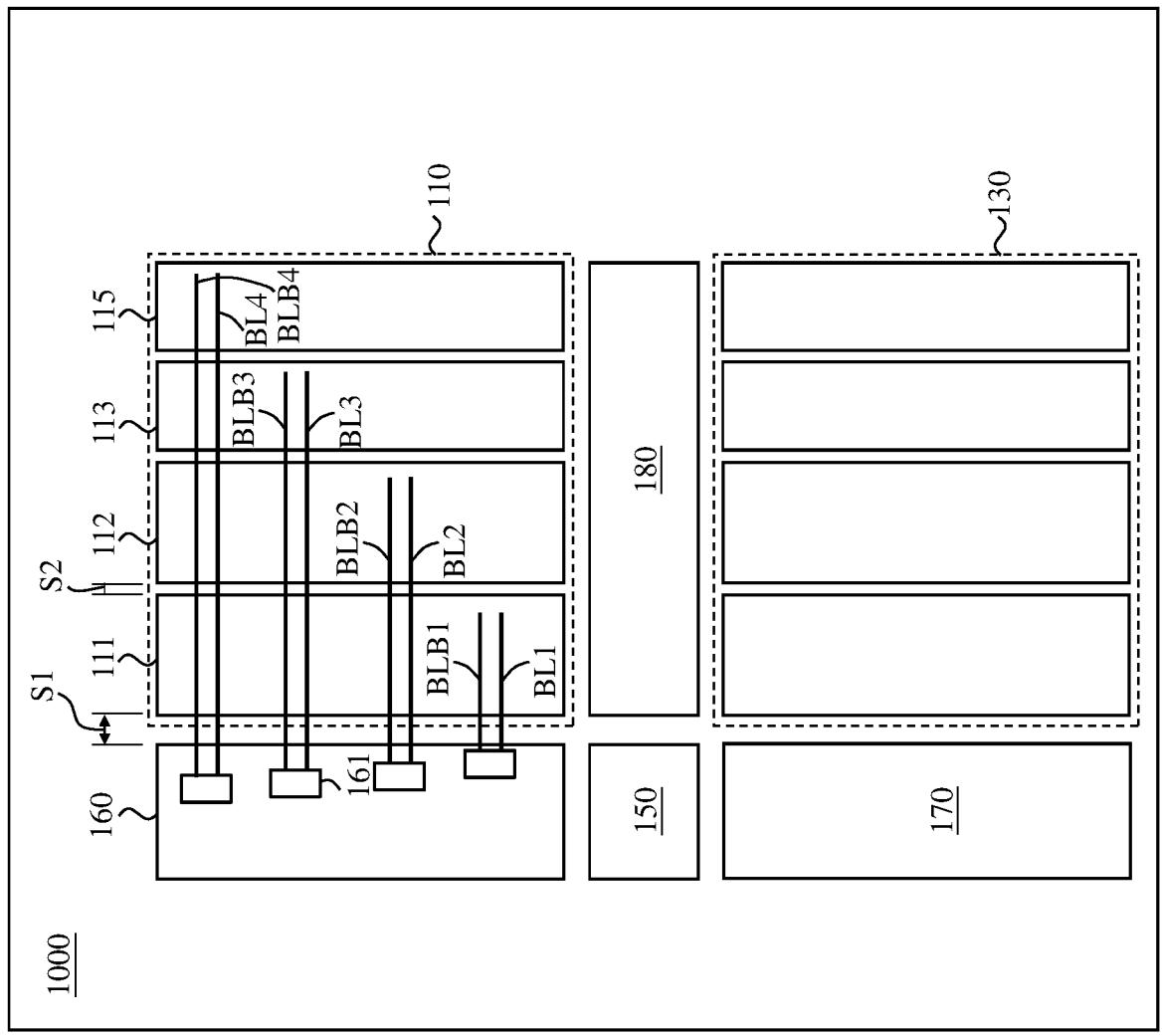
FIG. 10A is a schematic diagram of part of an integrated circuit.
Figure 10B:
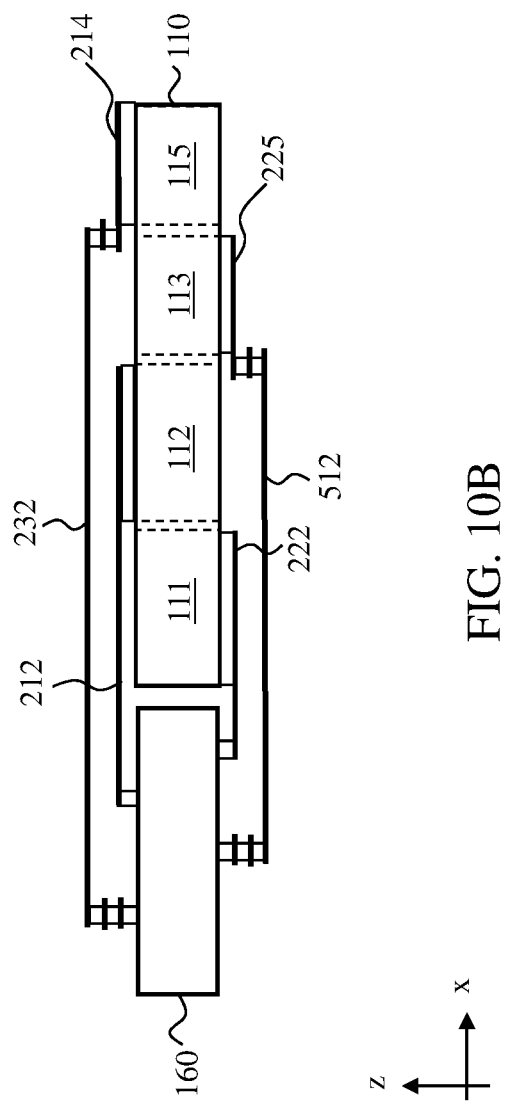
FIG. 10B is a cross-sectional view of the integrated circuit in FIG. 10A, in accordance with some embodiments.

Reference is now made to FIGS. 10A-10B. FIG. 10A is a schematic diagram of part of an integrated circuit 11, and FIG. 10B is a cross-sectional view of the integrated circuit 11, in accordance with some embodiments of the present disclosure. With respect to FIGS. 1-9B, like elements in FIGS. 10A-10B are designated with the same reference numbers for ease of understanding. In some embodiments, the integrated circuit 11 is configured with respect to, for example, the integrated circuit 4 of FIG. 4.

Compared with FIG. 4, instead of the memory segments 111-113 and 115 having equal number of memory cells, in the embodiments of FIGS. 10A-10B, each of the memory segments 111-112 has a number of memory cells that is greater than a number of memory cells included in each of the memory segments 113 and 115. For example, in some embodiments, each of the memory segments 111-112 includes 72 memory cells in a column while each of the memory segments 113 and 115 includes 56 memory cells in a column.

With reference to FIGS. 10A-10B together, the memory segments 111 and 113, are coupled to the input/output circuit 160 at least through, for example, the back side conductive lines 222, 512, and 225, and the memory segments 112 and 115, are coupled to the input/output circuit 160 at least through, for example, the front side conductive lines 212, 232, and 214.

Moreover, compared with some approaches having folded bit line configurations (for example, each of two local input/output circuits interposed in and coupled to two memory arrays), the present application provides dual sided data lines for each single memory bank and significantly reduces memory device area by about 8%.

The configurations of FIGS. 10A-10B are given for illustrative purposes. Various implements are within the contemplated scope of the present disclosure. For example, in some embodiments, the numbers of the memory cells MC in the memory segments 111-113 and 115 are more or less than 72 and 56 memory cells.

Figure 11:
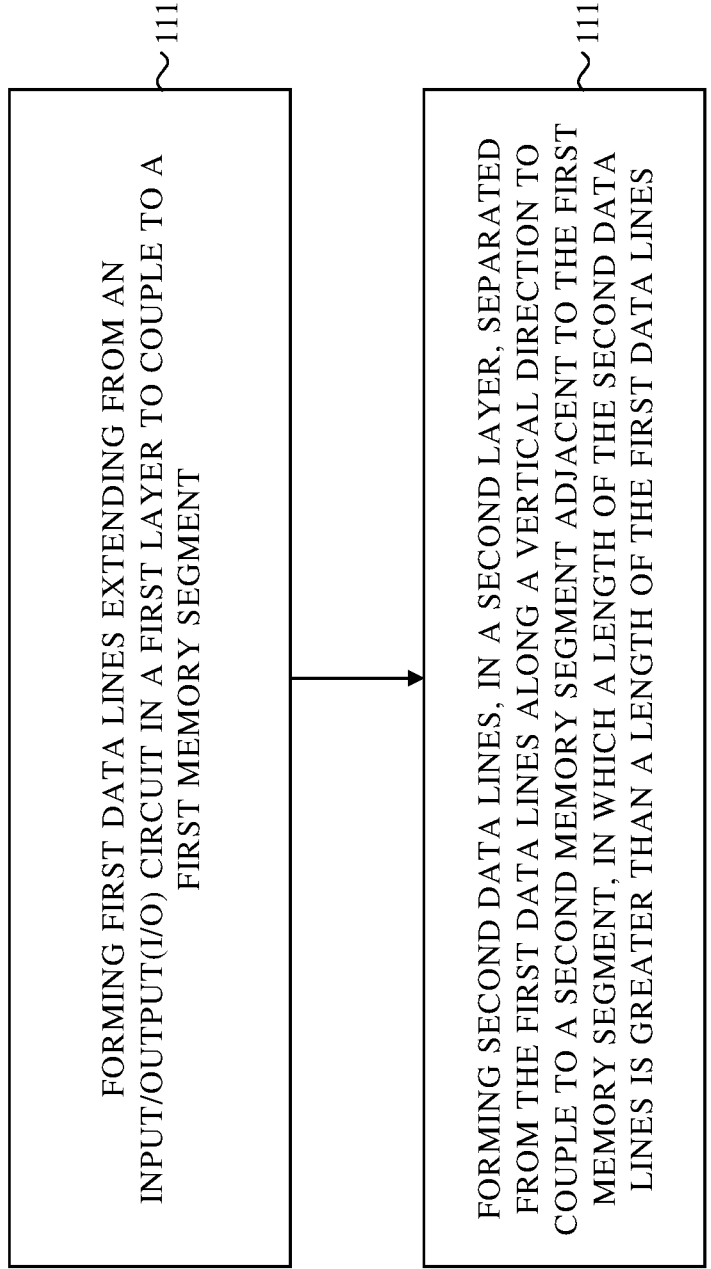
FIG. 11 is a flow chart of a method of manufacturing an integrated circuit, in accordance with some embodiments.

Reference is now made to FIG. 11. FIG. 11 is a flow chart of a method 1100 of manufacturing an integrated circuit, in accordance with some embodiments. It is understood that additional operations can be provided before, during, and after the processes shown by FIG. 11, and some of the operations described below can be replaced or eliminated, for additional embodiments of the method. The order of the operations/processes may be interchangeable. Throughout the various views and illustrative embodiments, like reference numbers are used to designate like elements. The method 1100 includes operations 1111-1112 that are described below with reference to the cells in integrated circuits in FIGS. 1-10B.

In operation 1111, as shown in FIGS. 1-2B, data lines BL1-BLB1, including the front side conductive lines 211-212, are formed to extend from the input/output circuit 160 in the first layer to couple to the memory segment 111.

In operation 1112, for example, data lines BL2-BLB2, including the back side conductive lines 221-222, are formed in a second layer and separated from the data lines BL1-BLB1 along a vertical direction (z direction) to couple to the memory segment 112 adjacent to the memory segment 111. The length of the data lines BL2-BLB2 is greater than a length of the data lines BL1-BLB1.

In some embodiments, as shown in FIG. 2A, the width W2 of the data lines BL2-BLB2, including the back side conductive lines 221-222, is greater than the W1 of the data lines BL1-BLB1, including the front side conductive lines 211-212. The data lines BL1-BLB1 and BL2-BLB2 overlap with each other in the layout view.

In some embodiments, as shown in FIGS. 5A-5B, the method 1100 further includes operations of forming data lines BL4-BLB4, having portions, including the back side conductive lines 511-512, in a third layer below the first and second layers and portions, including the back side conductive lines 224-225, in the second layer. The data lines BL4-BLB4 are coupled to the memory segment 115. The width W4 of the back side conductive lines 511-512 is greater than the widths W1-W3.

Figure 12:
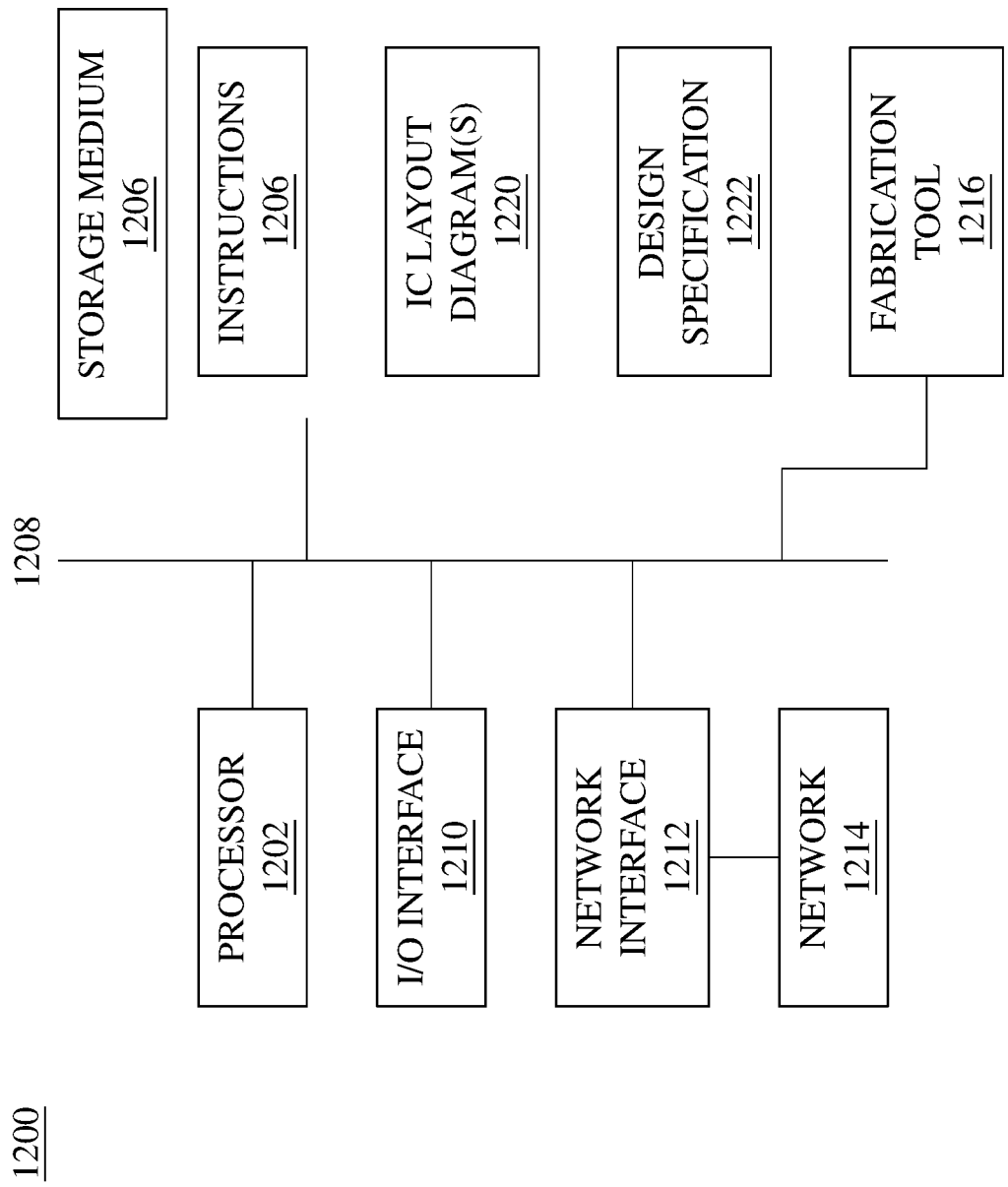
FIG. 12 is a block diagram of a system for designing the integrated circuit layout design, in accordance with some embodiments of the present disclosure.

Reference is now made to FIG. 12. FIG. 12 is a block diagram of an EDA system 1200 for designing the integrated circuit layout design, in accordance with some embodiments of the present disclosure. EDA system 1200 is configured to implement one or more operations of the method 1100 disclosed in FIG. 11, and further explained in conjunction with FIGS. 1-11. In some embodiments, EDA system 1200 includes an APR system.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code (instructions) 1206, i.e., a set of executable instructions. Execution of instructions 1206 by hardware processor 1202 represents (at least in part) an EDA tool which implements a portion or all of, e.g., the method 1100.

The processor 1202 is electrically coupled to computer-readable storage medium 1204 via a bus 1208. The processor 1202 is also electrically coupled to an I/O interface 1210 and a fabrication tool 1216 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. The processor 1202 is configured to execute computer program code 1206 encoded in computer-readable storage medium 1204 in order to cause EDA system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause EDA system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores IC layout diagram 1220 of standard cells including such standard cells as disclosed herein, for example, a cell including in the integrated circuit 1, 4, 6, 9 and/or 11 discussed above with respect to FIGS. 1-11.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows EDA system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1264. In one or more embodiments, a portion or all of noted processes and/or methods, is implemented in two or more systems 1200.

EDA system 1200 also includes the fabrication tool 1216 coupled to processor 1202. The fabrication tool 1216 is configured to fabricate integrated circuits, e.g., the integrated circuit 1, 4, 6, 9 and/or 11 illustrated in FIGS. 1-11, according to the design files processed by the processor 1202.

EDA system 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as design specification 1222.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 13:
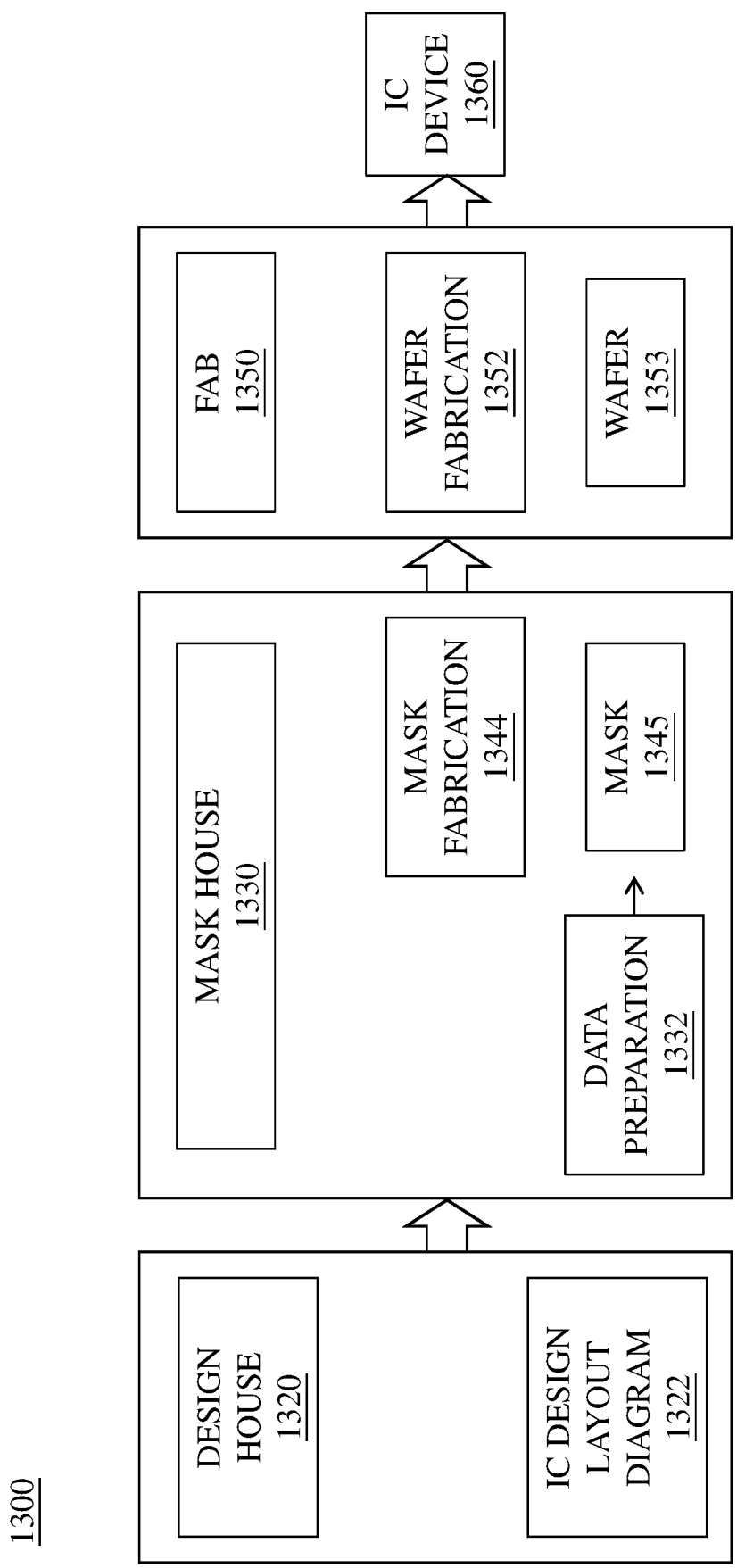
FIG. 13 is a block diagram of an integrated circuit manufacturing system, and an integrated circuit manufacturing flow associated therewith, in accordance with some embodiments.

Reference is now made to FIG. 13. FIG. 13 is a block diagram of IC manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in IC manufacturing system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns, for example, an IC layout design depicted in FIGS. 1-11, designed for an IC device 1360, for example, the integrated circuits 1, 4, 6, 9 and/or 11 discussed above with respect to FIGS. 1-10B. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The IC design layout diagram 1322 is manipulated by mask data preparation 1332 to comply with particular characteristics of the mask writer and/or requirements of IC fab 1350. In FIG. 13, data preparation 1332 and mask fabrication 1344 are illustrated as separate elements. In some embodiments, data preparation 1332 and mask fabrication 1344 can be collectively referred to as mask data preparation.

In some embodiments, data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1345 includes a transparent substrate (for example, fused quartz) and an opaque material (for example, chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 includes wafer fabrication 1352. IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

As described above, the present disclosure provides memory devices in integrated circuits having dual sided data lines. By utilizing metal lines having greater width on the back side for memory segments including more memory cells, less resistance and capacitance are experienced by the data signal, compared with some approaches. Accordingly, the performance, such like the operation speed, is improved.

According to some embodiments of the present disclosure, a memory device in an integrated circuit is provided, including an input/output (I/O) circuit, a first memory segment and a second memory segment that separated from the first memory segment in a first direction, a first pair of data lines on a first side of the integrated circuit, extending in the first direction and configured to couple the first memory segment to the I/O circuit, and a second pair of data lines separated from the first pair of data lines in a second direction, different from the first direction, on a second side, opposite to the first side, of the integrated circuit, and configured to couple the second memory segment to the I/O circuit. A first width of the first pair of data lines is different from a second width of the second pair of data lines.

According to some embodiments of the present disclosure, a memory device in an integrated circuit is provided, including a first pair of complementary data lines that are arranged in a first layer on a first side of the integrated circuit and coupled to a plurality of first memory cells in a first column, and a second pair of complementary data lines that are arranged in a first layer on a second side, opposite to the first side, of the integrated circuit and coupled to a plurality of second memory cells in the first column. Lengths of the first and second pairs of complementary data lines are different from each other, and widths of the first and second pairs of complementary data lines are different from each other.

According to some embodiments of the present disclosure, a method is provided, including operations as below:

forming multiple first data lines extending from an input/output (I/O) circuit in a first layer to couple to a first memory segment; and forming multiple second data lines, in a second layer, separated from the first data lines along a vertical direction to couple to a second memory segment adjacent to the first memory segment. A length of the second data lines is greater than a length of the first data lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device in an integrated circuit, comprising:
an input/output (I/O) circuit;
a first memory segment and a second memory segment that is separated from the first memory segment in a first direction;
a first pair of data lines on a first side of the integrated circuit, extending in the first direction and configured to couple the first memory segment to the I/O circuit; and
a second pair of data lines separated from the first pair of data lines in a second direction, different from the first direction, on a second side, opposite to the first side, of the integrated circuit, and configured to couple the second memory segment to the I/O circuit,
wherein a first width of the first pair of data lines is different from a second width of the second pair of data lines.

2. The memory device of claim 1, wherein the first side and the second side of the integrate circuit correspond to a front side and a back side of the integrate circuit respectively.

3. The memory device of claim 2, further comprising:
a pair of vias each having a rectangular surface coupled to one of the second pair of data lines; and
a first metal track between the second pair of data lines on the second side of the integrated circuit.

4. The memory device of claim 1, further comprising:
a third memory segment, wherein the second memory segment is interposed between the first and third memory segments; and
a third pair of data lines on the first side of the integrated circuit and configured to couple the third memory segment to the I/O circuit.

5. The memory device of claim 4, wherein each of the first and third memory segments comprises a first number of memory cells which is smaller than a second number of memory cells included in the second memory segment.

6. The memory device of claim 4, wherein the first memory segment is arranged closest to the I/O circuit and comprises a largest number of memory cells, compared to the second and third memory segments.

7. The memory device of claim 1, further comprising:
a third memory segment and a fourth memory segment, wherein the second and third memory segments are interposed between the first and fourth memory segments;
a third pair of data lines on the first side of the integrated circuit, coupled to the third memory segment, and comprising first portions in a first layer and second portions, passing the first and second memory segments, in a second layer above the first layer; and
a fourth pair of data lines on the second side of the integrated circuit, coupled to the fourth memory segment, and comprising first portions in a third layer and second portions, passing the first to third memory segments, in a fourth layer below the first to third layers.

8. The memory device of claim 7, wherein each of the first and second memory segments comprises a first number of memory cells which is greater than a second number of memory cells included in each of the third and fourth memory segments.

9. The memory device of claim 1, wherein the first side is a backside of the integrated circuit, and the second side is a front side of the integrated circuit,
wherein the first memory segment, comprising a first number of memory cells, is arranged closer to the I/O circuit than the second memory segment, comprising a second number, smaller than the first number, of memory cells.

10. A memory device in an integrated circuit, comprising:
a first pair of complementary data lines that are arranged in a first layer on a first side of the integrated circuit and coupled to a plurality of first memory cells in a first column; and
a second pair of complementary data lines that are arranged in a first layer on a second side, opposite to the first side, of the integrated circuit and coupled to a plurality of second memory cells in the first column,
wherein lengths of the first and second pairs of complementary data lines are different from each other, and widths of the first and second pairs of complementary data lines are different from each other.

11. The memory device of claim 10, further comprising:
a third pair of complementary data lines comprising first portions arranged in the first layer on the first side of the integrated circuit and second portions that are arranged in a second layer above the first layer on the first side of the integrated circuit and pass the plurality of first memory cells and the plurality of second memory cells,
wherein the third pair of complementary data lines are coupled to a plurality of third memory cells in the first column.

12. The memory device of claim 11, wherein the first and second sides of the integrated circuit correspond to front and back sides of the integrated circuit respectively,
wherein a number of the plurality of second memory cells is greater than a number of the plurality of first memory cells and a number of the plurality of third memory cells.

13. The memory device of claim 11, further comprising:
a fourth pair of complementary data lines comprising first portions arranged in the first layer on the second side of the integrated circuit and second portions that are arranged in a second layer below the first layer on the second side of the integrated circuit,
wherein the fourth pair of complementary data lines are coupled to a plurality of fourth memory cells in the first column, and the fourth pair of complementary data lines have a longest length among the first to fourth pairs of complementary data lines.

14. The memory device of claim 10, further comprising:
a third pair of complementary data lines that are arranged in the first layer on the first side of the integrated circuit and coupled to a plurality of third memory cells in a second column; and
a fourth pair of complementary data lines that are arranged in the first layer on the second side of the integrated circuit and coupled to a plurality of fourth memory cells in the second column,
wherein the first and third pairs of complementary data lines are mirror images with respect to an input/output (I/O) circuit, and
the second and fourth pairs of complementary data lines are mirror images with respect to the I/O circuit.

15. The memory device of claim 10, further comprising:
an input/output (I/O) circuit apart from the plurality of the first memory cells by a first spacing, wherein a second spacing between the plurality of the first memory cells and the plurality of second memory cells is smaller than the first spacing.

16. A method, comprising:
forming a plurality of first data lines extending from an input/output (I/O) circuit in a first layer to couple to a first memory segment; and
forming a plurality of second data lines, in a second layer, separated from the plurality of first data lines along a vertical direction to couple to a second memory segment adjacent to the first memory segment, wherein a length of the plurality of second data lines is greater than a length of the plurality of first data lines in a cross-sectional view.

17. The method of claim 16, wherein a width of the plurality of second data lines is greater than a width of the plurality of first data lines.

18. The method of claim 16, further comprising:
forming a plurality of third data lines having first portions in a third layer below the first and second layers and second portions in the second layer, wherein the plurality of third data lines are coupled to a third memory.

19. The method of claim 18, wherein a width of the first portions in the plurality of third data lines is greater than widths of the plurality of first data lines, the plurality of second data lines and the second portions in the plurality of third data lines.

20. The method of claim 16, wherein the plurality of first data lines and the plurality of second data lines overlap with each other in a layout view.

* * * * *